(12) United States Patent
Kawamura

(10) Patent No.: US 6,747,894 B2
(45) Date of Patent: Jun. 8, 2004

(54) NONVOLATILE MULTILEVEL CELL MEMORY

(75) Inventor: Shoichi Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 14 days.

(21) Appl. No.: 10/299,756

(22) Filed: Nov. 20, 2002

(65) Prior Publication Data

US 2003/0169621 A1 Sep. 11, 2003

(30) Foreign Application Priority Data

Mar. 8, 2002 (JP) ........................................ 2002-062915

(51) Int. Cl.[7] ............................................... G11C 16/00
(52) U.S. Cl. .............................. 365/185.03; 365/185.2; 365/185.22
(58) Field of Search ...................... 365/185.03, 185.09, 365/185.2, 185.22

(56) References Cited

U.S. PATENT DOCUMENTS 6,191,977 B1 * 2/2001 Lee ........................ 365/185.21
6,473,338 B2 * 10/2002 Sugimura ............... 365/185.03
6,529,405 B2 * 3/2003 Chang .................... 365/185.03

* cited by examiner

Primary Examiner—Tan T Nguyen
(74) Attorney, Agent, or Firm—Arent Fox PLLC

(57) ABSTRACT

First and second memory units store reference values and verification values for generating reference voltages and verification voltages of nonvolatile multilevel memory cells. A reference voltage generator generates the reference voltages and the verification voltages according to the reference values and the verification values stored in the first and second memory units. Since the first and second memory units are rewritable, the reference voltages and the verification voltages can be set after the fabrication of the cell memory in accordance with the characteristics of the memory cells which are dependent on variations of fabrication process. A programming test circuit for obtaining the reference voltages and the verification voltages can also be used to set the reference voltages and the verification voltages after the fabrication of the cell memory. Consequently, it is possible to improve the read margins of data read from the memory cells with an enhancement in fabrication yield.

19 Claims, 16 Drawing Sheets

NONVOLATILE MULTILEVEL CELL MEMORY

BACKGROUND OF THE INVENTION

1. Field of the Invention

The present invention relates to a nonvolatile multilevel cell memory, and more particularly, to a technology for performing read operations and write operations with reliability.

2. Description of the Related Art

Nonvolatile semiconductor memories such as a flash memory store data by injecting electrons into the floating gates (or trap gates) of their memory cells to change the threshold voltages of the memory cells. The memory cells rise in threshold voltage when their floating gates contain electrons, and fall when the floating gates contain no electron.

Recently, flash memories that store a plurality of bits in each single memory cell have been developed in order to increase memory capacities.

FIG. 1 shows the distribution of the threshold voltages of memory cells in a four-level NAND type flash memory. The threshold voltages of the respective memory cells fall into any of areas L0, L1, L2, and L3 depending on the data programmed. The areas L0, L1, L2, and L3 correspond to 2-bit data "11", "10", "01", and "00", respectively. The memory cells of the area L0 have negative threshold voltages and operate as depletion transistors. The memory cells of the areas L1–L3 have positive threshold voltages and operate as enhancement transistors.

Data write (programming) is performed on each memory cell until the threshold voltage exceeds a verification voltage VV (VV1, VV2, VV3). For example, to write logic "10" to a memory cell, the programming operation is repeated until the memory cell exceeds the verification voltage VV1 in threshold voltage. Then, the threshold voltages of the respective memory cells are set to any of the areas L0–L3.

Data read is performed by comparing the threshold voltages of the memory cells with reference voltages VR (VR1, VR2, VR3). When a memory cell falls below the reference voltage VR1 in threshold voltage, the data retained in the memory cell is determined to be "11". When a memory cell lies between the reference voltages VR1 and VR2 in threshold voltage, the data retained in the memory cell is determined to be "10". When a memory cell lies between the reference voltages VR2 and VR3 in threshold voltage, the data retained in the memory cell is determined to be "01". When a memory cell exceeds the reference voltage VR3 in threshold voltage, the data retained in the memory cell is determined to be "00".

A reference voltage (conduction voltage) VR4 is supplied to unselected memory cells and selecting transistors to be described later. The reference voltage VR4 is set with a sufficient margin from the area L3.

FIG. 2 shows an overview of a memory cell array of the four-level NAND type flash memory.

The memory cell array comprises a plurality of blocks BLK (BLK0, BLK1, ... ) and page buffers having sense amplifiers SA. Each block BLK has a plurality of memory cell strings STR. The memory cell strings STR are composed of a plurality of memory cells that are connected in series between selecting transistors. The memory cells have a control gate and a floating gate. Each memory cell is connected at its control gate to a word line WL. The gates of the selecting transistors are each connected to a selecting line SG. Each memory cell string STR is connected at both ends to a bit line BL and a control line ARVSS.

Write operations on the memory cells are performed by supplying a high voltage to word lines WL corresponding to the memory cells to be written and supplying a low voltage to a bit line BL so that electrons are injected to the floating gates of the memory cells through the channels.

Read operations on the memory cells are performed by supplying a reference voltage VR (any of VR1, VR2, and VR3) to word lines WL (for example, WL10 and WL11) corresponding to the memory cells to be read (for example, the circled ones in the diagram), supplying the reference voltage VR4 to the other word lines WL and the selecting lines SG, and supplying a ground voltage to the control line ARVSS. When memory cells to be read exceed the reference voltage VR in threshold voltage, no channel is formed in the memory cells. In this case, no current flows from the bit lines BL to the control line ARVSS. When memory cells to be read fall below the reference voltage VR in threshold voltage, channels are formed in the memory cells and thus currents flow from the bit lines BL to the control line ARVSS. The sense amplifiers SA compare the currents flowing through the bit lines BL with reference currents to determine whether the threshold voltages are higher than the respective reference voltages VR. Then, the logical values of the data stored in the memory cells are determined.

Erase operations on the memory cells are performed by supplying a low voltage to the control gates of the memory cells to be erased and supplying a high voltage to the well regions of the memory cells so as to emit the electrons stored in the floating gates. Here, the control gates of the memory cells not to be erased are rendered floating, for example.

To store multilevel data in a single nonvolatile memory cell, a plurality of reference voltages VR (VR1–VR3) must be each located in between the distributions (L0–L3) of the threshold voltages as shown in FIG. 1. On this account, multilevel memory cells get considerably smaller in read margin as compared to binary memory cells which have a single reference voltage. Consequently, when variations of the semiconductor fabrication process change the write characteristics of the memory cells and shift the distributions L1–L3, insufficient read margins can possibly cause defects.

FIG. 3 shows the distributions of the threshold voltages for situations where the memory cells change in write characteristics. In the diagram, the distributions shown by the broken lines are the normal ones shown in FIG. 1.

For example, if the rates of change of the threshold voltages to write voltages increase due to variations of the fabrication process, the distributions L1–L3 range wider. As a result, a difference between the maximum value in the distribution L1 of the threshold voltages corresponding to logic "10" and the reference voltage VR2 (read margin for logic "10") decreases. Similarly, a difference between the maximum value in the distribution L2 of the threshold voltages corresponding to logic "01" and the reference voltage VR3 (read margin for logic "01") decreases. In particular, when the distribution L2 ranges wider as shown in the diagram, the read margin for logic "01" might practically disappear.

Generally, semiconductor products vary in chip characteristics depending on the positions of the chips on wafers, the positions of the wafers in fabrication lots, and the fabrication lots. For this reason, decreases in read margins can cause a drop in yield. The lower yield in turn can increase the fabrication cost.

SUMMARY OF THE INVENTION

It is an object of the present invention to secure operating margins of a nonvolatile multilevel cell memory in order to enhance a fabrication yield.

According to one of the aspects of the nonvolatile multilevel cell memory of the present invention, the cell memory has electrically-rewritable nonvolatile multilevel memory cells. A programming voltage generator generates a plurality of programming voltages to change threshold voltage in each of the memory cells according to logic of write data. A first memory unit stores a plurality of reference values respectively corresponding to a plurality of reference voltages for judging the threshold voltages of the memory cells. At least one of the reference values stored in the first memory unit is rewritable. A reference voltage generator generates the reference voltages, respectively, according to the reference values stored in the first memory unit, when reading data from the memory cells.

Since the reference value(s) for generating the reference voltage(s) is/are rewritable, the reference values can be modified in accordance with the characteristics of the memory cells evaluated in advance. That is, the reference voltages can be changed after the fabrication of the cell memory. Since the reference voltages can be changed in accordance with the characteristics of the memory cells which are dependent on variations of fabrication process, it is possible to improve the read margins of data read from the memory cells. This results in an enhanced fabrication yield.

According to another aspect of the nonvolatile multilevel cell memory of the present invention, the cell memory has electrically-rewritable nonvolatile multilevel memory cells. A programming voltage generator generates a plurality of programming voltages to change threshold voltage in each of the memory cells according to logic of write data. A second memory unit stores a plurality of verification values respectively corresponding to a plurality of verification voltages for verifying distributions of the threshold voltages of the memory cells. At least one of the verification values stored in the second memory unit is rewritable. A verification voltage generator generates the verification voltages, respectively, according to the verification values stored in the second memory unit, when writing data to the memory cells.

Since the verification value(s) for generating the verification voltage(s) is/are rewritable, the verification values can be modified in accordance with the characteristics of the memory cells evaluated in advance. That is, the verification voltages can be changed after the fabrication of the cell memory. Since the verification voltages can be changed in accordance with the characteristics of the memory cells which are dependent on variations of fabrication process, the distributions of the threshold voltages corresponding to the logical values of write data can be optimized in accordance with the write characteristics of the memory cells. As a result, it is possible to improve the read margins of the memory cells with an enhancement in fabrication yield.

According to another aspect of the nonvolatile multilevel cell memory of the present invention, the cell memory has electrically-rewritable nonvolatile multilevel memory cells. A programming voltage generator generates a plurality of programming voltages to change threshold voltage in each of the memory cells according to logic of write data. A programming test circuit operates in a test mode, programs each of the memory cells according to the logic of the write data, and obtains at least one of reference voltages and at least one of verification voltages based on distributions of the threshold voltages of the memory cells programmed.

A reference voltage generator generates a plurality of reference voltages for judging the threshold voltages of the memory cells when reading data from the memory cells. The reference voltage generator generates at least one of the reference voltages according to a value obtained by the programming test circuit. A verification voltage generator generates, when writing data to the memory cells, a plurality of verification voltages for verifying that the threshold voltages of the memory cells exceed a value corresponding to the data. The verification voltage generator generates at least one of the verification voltages according to a value obtained by the programming test circuit.

Consequently, after the fabrication of the cell memory, the programming test circuit can directly evaluate the characteristics of the memory cells and set the reference voltages and the verification voltages within the chip. Since the reference voltages and the verification voltages can be set in accordance with the characteristics of the memory cells which are dependent on variations of fabrication process, it is possible to improve the read margins of data read from the memory cells. In addition, the distributions of the threshold voltages corresponding to the logical values of write data can be optimized in accordance with the write characteristics of the memory cells. This results in an enhanced fabrication yield.

Furthermore, since the programming test circuit built in the cell memory can set the reference voltages and the verification voltages, the test time can be shortened with a reduction in fabrication cost.

According to another aspect of the nonvolatile multilevel cell memory of the present invention, a first memory unit stores a plurality of reference values corresponding to the reference voltages, respectively. At least one of the reference values stored in the first memory unit is rewritable. The reference voltage generator generates the reference voltages according to the reference values stored in the first memory unit.

Since the reference voltage(s) can be set even from the exterior, the characteristics of the memory cells can be evaluated easily, for example, when developing the cell memory or when starting mass production.

According to another aspect of the nonvolatile multilevel cell memory of the present invention, a second memory unit stores a plurality of verification values corresponding to the verification voltages, respectively. At least one of the verification values stored in the second memory unit is rewritable. The verification voltage generator generates the verification voltages according to the verification values stored in the second memory unit.

Since the verification voltage(s) can be set even from the exterior, the characteristics of the memory cells can be evaluated easily, for example, when developing the cell memory or when starting mass production.

According to another aspect of the nonvolatile multilevel cell memory of the present invention, a lowest reference voltage out of the reference voltages and a lowest verification voltage out of the verification voltages are fixed values. The programming test circuit obtains at least one of the reference voltages excluding the lowest reference voltage and obtains at least one of the verification voltages excluding the lowest verification voltage.

Fixing the reference voltage and verification voltage corresponding to memory cell characteristics less susceptible to variations of fabrication process can simplify the logic of the programming test circuit. As a result, the cell memory can be reduced in chip size with a reduction in fabrication cost.

For example, fixing the lowest reference voltage to a ground voltage allows easy generation of this reference voltage.

According to another aspect of the nonvolatile multilevel cell memory of the present invention, the programming test circuit programs the memory cells with the lowest verification voltage, which is a fixed voltage. Next, the programming test circuit measures a highest threshold voltage of a plurality of memory cells programmed, and adds a first margin to the highest threshold voltage measured to obtain one of the reference voltages. Next, the programming test circuit adds a second margin to the obtained reference voltage to obtain next one of the verification voltages. Thereafter, the programming test circuit repeats the foregoing operations to obtain the reference voltages and the verification voltages.

That is, the programming test circuit obtains the subsequent ones of the reference voltages and verification voltages in succession by using the verification voltage that is a fixed voltage. Consequently, by repeating the simple operation flow, it is possible to obtain the reference voltages and the verification voltages in succession. As a result, the programming test circuit can be simplified in logic with a reduction in chip size.

For example, the memory cells each have a floating gate. The first margin is established in accordance with a charge-gain characteristic of increasing in number of electrons in the floating gate. The second margin is established in accordance with a charge-loss characteristic of decreasing in number of electrons in the floating gate.

According to another aspect of the nonvolatile multilevel cell memory of the present invention, a lowest reference voltage out of the reference voltages is a fixed value. The programming test circuit obtains at least one of the reference voltages excluding the lowest reference voltage and at least one of the verification voltages.

Fixing the reference voltage corresponding to memory cell characteristics less susceptible to variations of fabrication process can simplify the logic of the programming test circuit. As a result, the cell memory can be reduced in chip size with a reduction in fabrication cost.

For example, fixing the lowest reference voltage to a ground voltage allows easy generation of this reference voltage.

According to another aspect of the nonvolatile multilevel cell memory of the present invention, the programming test circuit adds a second margin to the lowest reference voltage, which is a fixed voltage, to obtain one of the verification voltages. Next, the programming test circuit measures a highest threshold voltage of a plurality of memory cells programmed with the obtained verification voltage, and adds a first margin to the highest threshold voltage measured to obtain next one of the reference voltages. Next, the programming test circuit adds a second margin to the obtained reference voltage to obtain another one of the verification voltages. Thereafter, the programming test circuit repeats the foregoing operations to obtain the reference voltages and the verification voltages.

That is, the programming test circuit obtains the subsequent ones of the verification voltages and reference voltages in succession by using the reference voltage that is a fixed voltage. Consequently, by repeating the simple operation flow, it is possible to obtain the reference voltages and the verification voltages in succession. As a result, the programming test circuit can be simplified in logic with a reduction in chip size.

For example, the memory cells each have a floating gate. The first margin is established in accordance with a charge-gain characteristic of increasing in the number of electrons in the floating gate. The second margin is established in accordance with a charge-loss characteristic of decreasing in number of electrons in the floating gate.

According to another aspect of the nonvolatile multilevel cell memory of the present invention, a conduction voltage generator generates, when accessing the memory cells, a conduction voltage to be applied to unselected memory cells in memory cell strings by adding a third margin to a maximum value in a highest distribution of threshold voltages out of a plurality of distributions of threshold voltages corresponding to the logic of the write data. The memory cell strings each have a plurality of the memory cells connected in series.

Since the conduction voltage can be changed in accordance with the distributions of the threshold voltages of the memory cells which are dependent on variations of fabrication process, the operating margins of the memory cells can be improved for an enhanced fabrication yield.

According to another aspect of the nonvolatile multilevel cell memory of the present invention, a third memory unit stores the conduction voltage as a conduction value. The conduction value stored in the third memory unit is rewritable. The conduction voltage generator generates, when accessing the memory cell strings each having a plurality of the memory cells connected in series, the conduction voltage to be applied to unselected memory cells in the memory cell strings according to the conduction value stored in the third memory unit. Consequently, the conduction voltage to be applied to unselected memory cells can be changed after the fabrication of the cell memory. Since the conduction voltage can be changed in accordance with the characteristics of the memory cells which are dependent on variations of fabrication process, it is possible to read data from the memory cells with reliability. The improved read margins allow an enhancement in fabrication yield.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described with reference to the drawings.

Figure 4:
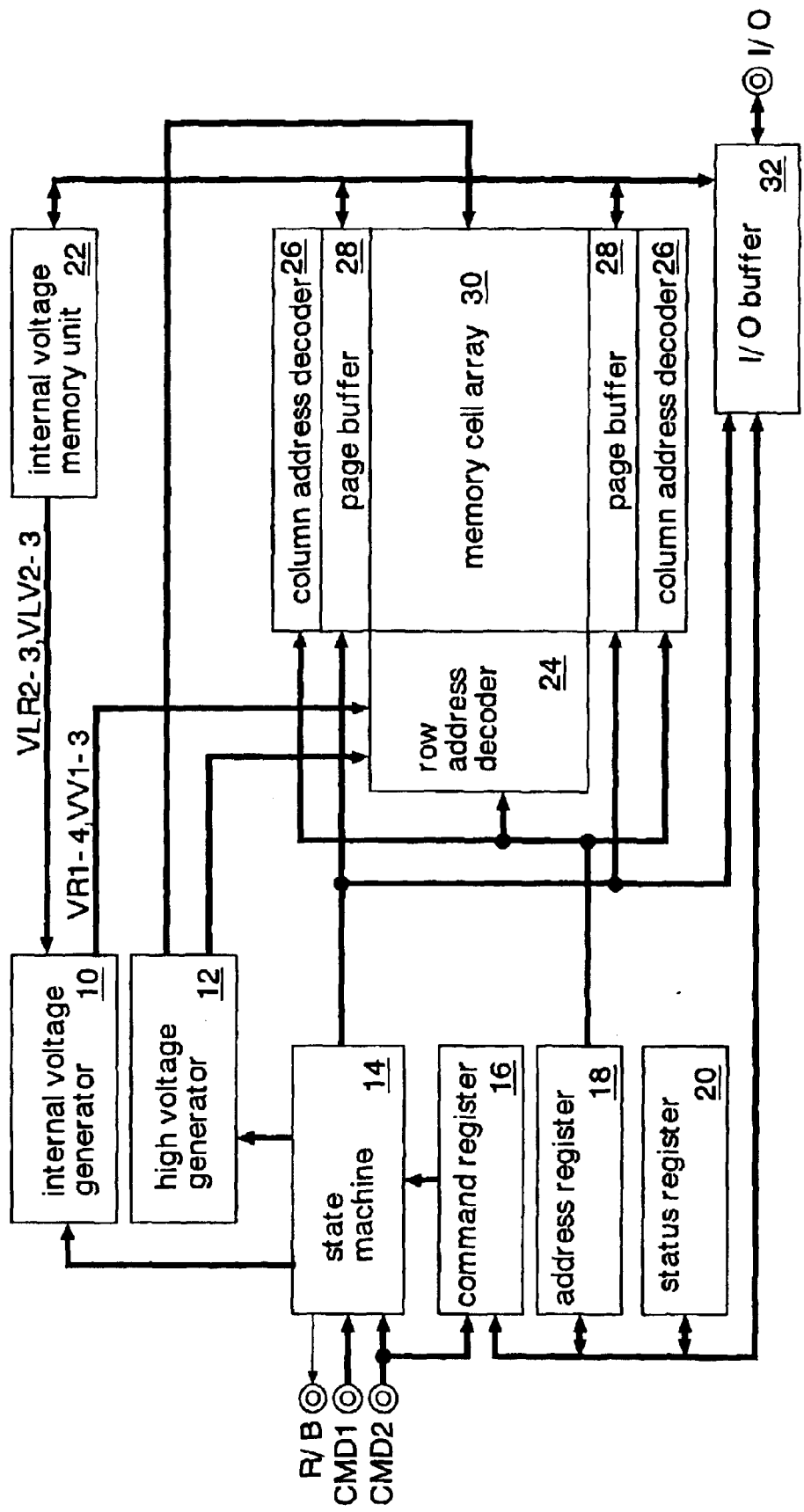
FIG. 4 is a block diagram showing a first embodiment of the present invention.

FIG. 4 shows a first embodiment of the nonvolatile multilevel cell memory of the present invention. The nonvolatile multilevel cell memory is formed as a 64-Mbit NAND type flash memory on a silicon substrate by using CMOS processes. In the drawings, each thick line represents a signal line that consists of a plurality of lines. Double circles in the diagram represent external terminals.

The flash memory comprises an internal voltage generator 10, a high voltage generator 12, a state machine 14, a command register 16, an address register 18, a status register 20, an internal voltage memory unit 22, a row address decoder 24, column address decoders 26, page buffers 28, a memory cell array 30, and an I/O buffer 32.

The internal voltage generator 10 generates a reference voltage VR1 (fixed to 0 V), a reference voltage VR4 (conduction voltage; fixed to 4 V), and a verification voltage VV1 (fixed to 0.3 V). It also generates reference voltages VR2, VR3 and verification voltages VV2, VV3 according to reference values VLR (VLR2, VLR3) and verification values VLV (VLV2, VLV3) from the internal voltage memory unit 22. The internal voltage generator 10 supplies the reference voltages VR and verification voltages VV generated to the row address decoder 24. That is, the internal voltage generator 10 operates as a reference voltage generator for generating the reference voltages VR and a verification voltage generator for generating the verification voltages VV. The reference voltage VR4 is a voltage to be supplied to unselected memory cells in memory cell strings and selecting transistors.

The high voltage generator 12 receives control signals from the state machine 14, generates high voltages such as programming voltages, and supplies the generated voltages to the row address decoder 24 and the memory cell array 30. That is, the high voltage generator 12 operates as a programming voltage generator.

The state machine 14 receives command signals CMD1 (including an address latch enable signal, a command latch enable signal, a spare area enable signal, and a write protect signal) and command signals CMD2 (including a chip enable signal, a read enable signal, and a write enable signal) supplied through external terminals, along with control signals from the command register 16. It generates timing signals for performing read operations, write operations (programming operations), and erase operations. The state machine 14 also outputs a ready/busy signal R/B depending on the state of the chip.

The command register 16 receives command signals supplied to an input/output terminal I/O, through the medium of the I/O buffer 32. It outputs the received signals to the state machine 14. The address register 18 receives address signals supplied to the input/output terminal I/O, through the medium of the I/O buffer 32. It outputs the received signals to the row address decoder 24 and the column address decoders 26. The I/O buffer 32 receives the command signals, the address signals, and data signals through the input/output terminal I/O. The data signals are input/output to/from the page buffers 28.

In a test mode to be described later, the internal voltage memory unit 22 receives, through the medium of the I/O buffer 32, the reference values VLR2, VLR3 corresponding to the reference voltages VR2, VR3 and the verification values VLV2, VLV3 corresponding to the verification voltages VV2, VV3, which are supplied to the input/output terminal I/O. The internal voltage memory unit 22 stores the received values. The reference values VLR2–3 and verification values VLV2–3 stored are output to the internal voltage generator 10. That is, the internal voltage memory unit 22 operates as a first memory unit for storing the reference values VLR and a second memory unit for storing the verification values VLV.

The row address decoder 24 selects predetermined word lines according to the address signal from the address register 18. The row address decoder 24 supplies the selected word lines with the reference voltages VR, the verification voltages VV, the programming voltages, etc. The column address decoders 26 select predetermined bit lines according to the address signal from the address register 18.

The page buffers 28 have a plurality of sense amplifiers. In write operations, the page buffers 28 hold write data that is supplied in succession from the input/output terminal I/O via the I/O buffer 32, and set the voltages of the bit lines according to the held data. In read operations, the page buffers 28 amplify read data from the memory cell array 30 with their sense amplifiers, and output the amplified data in succession to the input/output terminal I/O via the I/O buffer 32.

Figure 1:
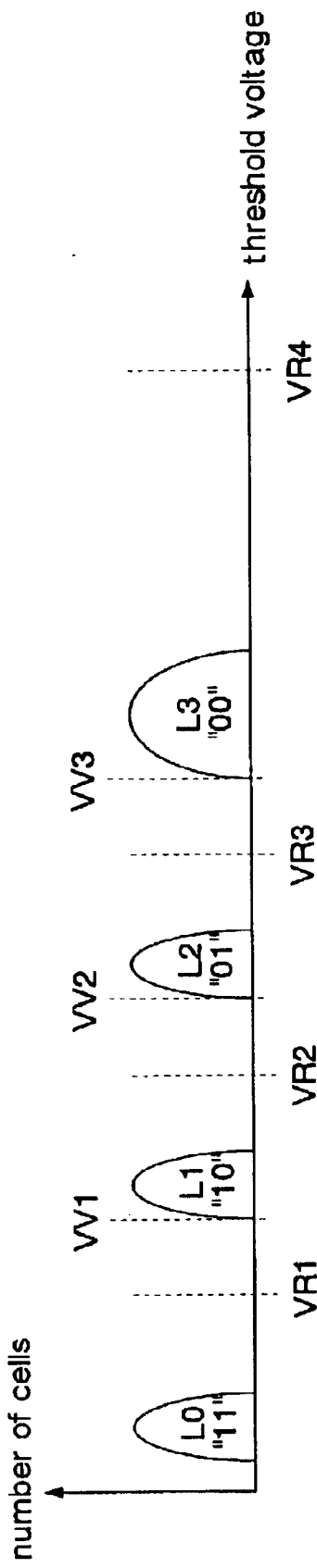
FIG. 1 is an explanatory diagram showing the distributions of the threshold voltages of memory cells in a conventional four-level NAND type flash memory.
Figure 2:
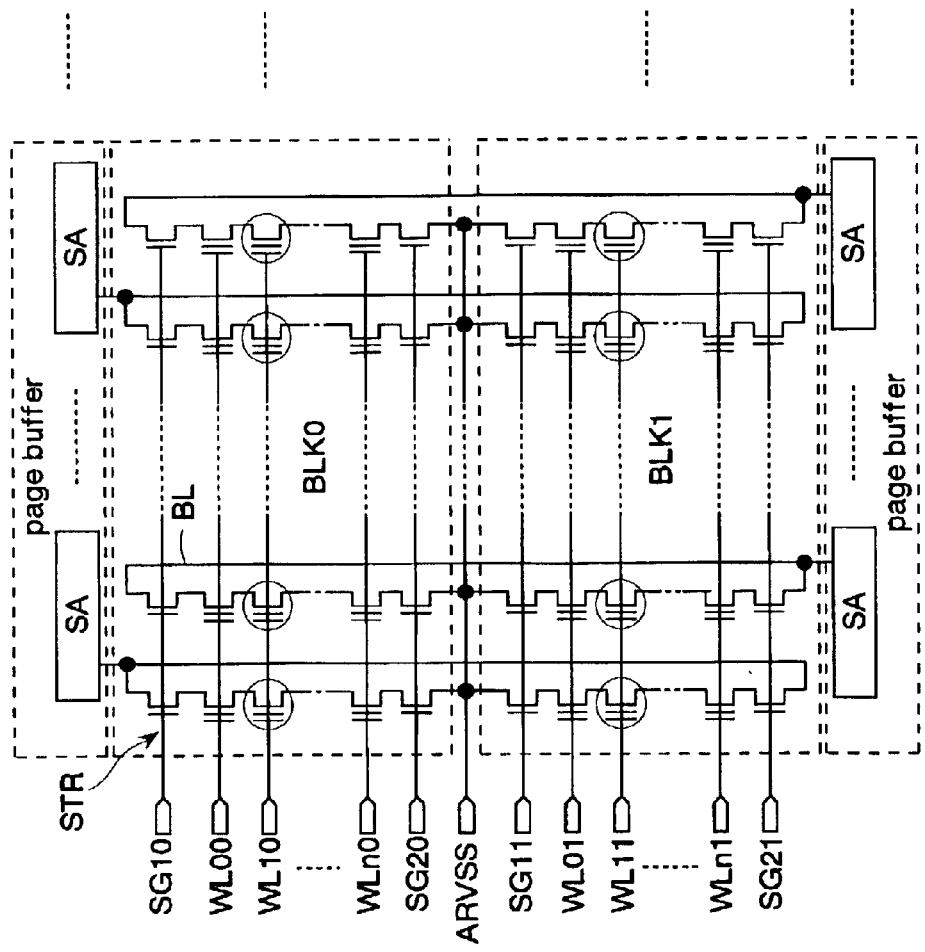
FIG. 2 is a circuit diagram showing an overview of a memory cell array of the conventional NAND type flash memory.
Figure 3:
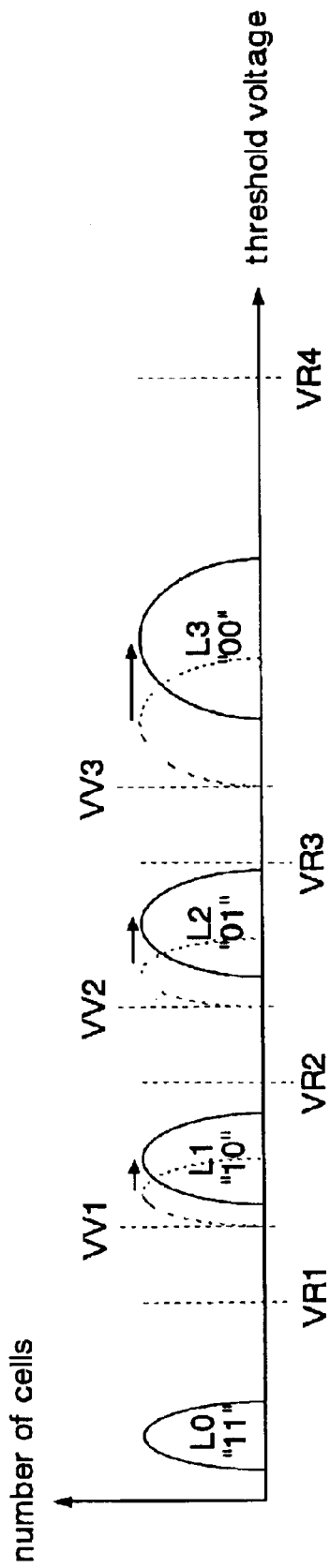
FIG. 3 is an explanatory diagram showing the distributions of the threshold voltages in FIG. 1 for situations where the memory cells change in write characteristics.

The memory cell array 30 is configured the same as heretofore (FIG. 2). That is, the memory cell array 30 is composed of a plurality of blocks BLK (BLK0, BLK1, ... ). Each block BLK has a plurality of memory cell strings STR. The memory cell strings STR are composed of a plurality of memory cells that are connected in series between selecting transistors. The memory cells have a control gate and a floating gate. The memory cells operate as nonvolatile four-level memory cells which are electrically rewritable. Each memory cell is connected at its control gate to a word line WL. The gates of the selecting transistors are each connected to a selecting line SG. Each memory cell string STR is connected at both ends to a bit line BL and a control line ARVSS.

Figure 5:
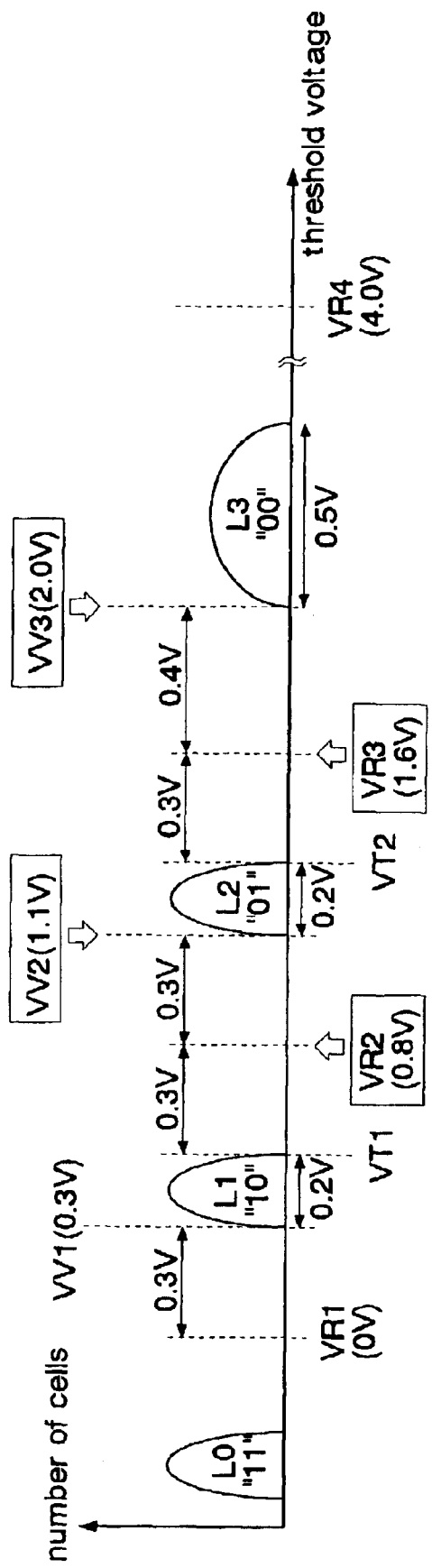
FIG. 5 is an explanatory diagram showing an overview of the setting of reference voltages and verification voltages according to the first embodiment.

FIG. 5 shows an overview of the setting of the reference voltages VR2, VR3 and the verification voltages VV2, VV3 according to the first embodiment. In this example, the framed reference voltages VR2, VR3 and verification voltages VV2, VV3 are set from the exterior of the flash memory. The reference voltages VR1 (0 V), VR4 (4 V) and the verification voltage VV1 (0.3 V) are fixed values to be generated by the internal voltage generator 10 shown in FIG. 4.

In a testing process, the flash memory is brought into the test mode by a command which is not used in normal operations, before the reference voltages VR2, VR3 and the verification voltages VV2, VV3 are set by using an LSI tester.

Initially, the reference voltage VR1 and the verification voltage VV1 generated by the internal voltage generator 10 are used to write logic "10" to a plurality of blocks BLK, and the distribution L1 is measured for characteristics (in this example, the distribution L1 has a width of 0.2 V). Monitoring the plurality of blocks BLK for threshold voltages allows the reference voltages and the verification voltages to be set in consideration of variations among the blocks BLK.

Next, taking the charge-gain characteristic of the memory cells into account, a first margin (0.3 V) is added to a maximum value VT1 in the distribution L1 to obtain the reference voltage VR2 (0.8 V). The first margin is obtained by adding a predetermined margin (design/fabrication margin; 0.1 V) to a maximum variation in threshold voltage (0.2 V) under the charge-gain characteristic. The charge-gain characteristic refers to the variation characteristic of the threshold voltage for situations where unexpected electrons are injected into the floating gates of the memory cells due to some operation of the flash memory.

Next, taking the charge-loss characteristic of the memory cells into account, a second margin (0.3 V) is added to the reference voltage VR2 to obtain the verification voltage VV2 (1.1 V) for writing logic "01" to the memory cells. The second margin is obtained by adding a predetermined margin (design/fabrication margin; 0.1 V) to a maximum variation in threshold voltage (0.2 V) under the charge-loss characteristic. The charge-loss characteristic refers to the variation characteristic of the threshold voltage for situations where unexpected electrons are emitted from the floating gates of the memory cells due to some operation of the flash memory.

Incidentally, the verification voltage VV2 may be obtained by adding the first and second margins to the maximum value VT1 in the distribution L1, or by adding the second margin to the reference voltage VR2. Otherwise, the first and second margins may be initially added to the maximum value VT1 to obtain the verification voltage VV2 before the reference voltage VR2 is obtained by subtracting the second margin from the verification voltage VV2.

Next, the reference voltage VV2 obtained is used to write logic "01" to a plurality of blocks BLK, and the distribution L2 is measured for characteristics (in this example, the distribution L2 has a width of 0.2 V).

Next, taking the charge-gain characteristic of the memory cells into account, a first margin is added to a maximum value VT2 in the distribution L2 to obtain the reference voltage VR3 (1.6 V), as is the case above. In addition, taking the charge-loss characteristic of the memory cells into account, a second margin is added to the reference voltage VR3 to obtain the verification voltage VV3 (2.0 V) for writing logic "00" to the memory cells. Here, the maximum variation of the threshold voltage according to the charge-loss characteristic for the distribution L3 is set at 0.3 V. Hence, the second margin corresponding to the distribution L3 is 0.4 V.

Then, the reference values VLR2–3 corresponding to the reference voltages VR2–3 and the verification values VLV2–3 corresponding to the verification voltages VV2–3 obtained by using the LSI tester are written to the internal voltage memory unit 22 shown in FIG. 4 during the test mode. Since the characteristics of the memory cells are thus directly measured to set the reference voltages VR2–3 (reference values VLR2–3) and the verification voltages VV2–3 (verification values VLV2–3), it is possible to secure predetermined read margins (in this example, 0.3 V or 0.4 V) all the time regardless of variations of the fabrication process.

Incidentally, the first margins and the second margins are determined at the time of developing the semiconductor processes for manufacturing the flash memory or at the time of prototyping the flash memory. The reference voltages VR2–3 and the verification voltages VV2–3 are obtained, for example, once for each lot. Then, the same reference voltages VR2–3 and verification voltages VV2–3 are written to all the chips in the lot.

The reference voltages VR2–3 and the verification voltages VV2–3 may be obtained by measuring a plurality of blocks BLK within an identical chip for the distributions L1 and L2, or by measuring a plurality of chips within an identical wafer for the distributions L1 and L2.

Figure 6:
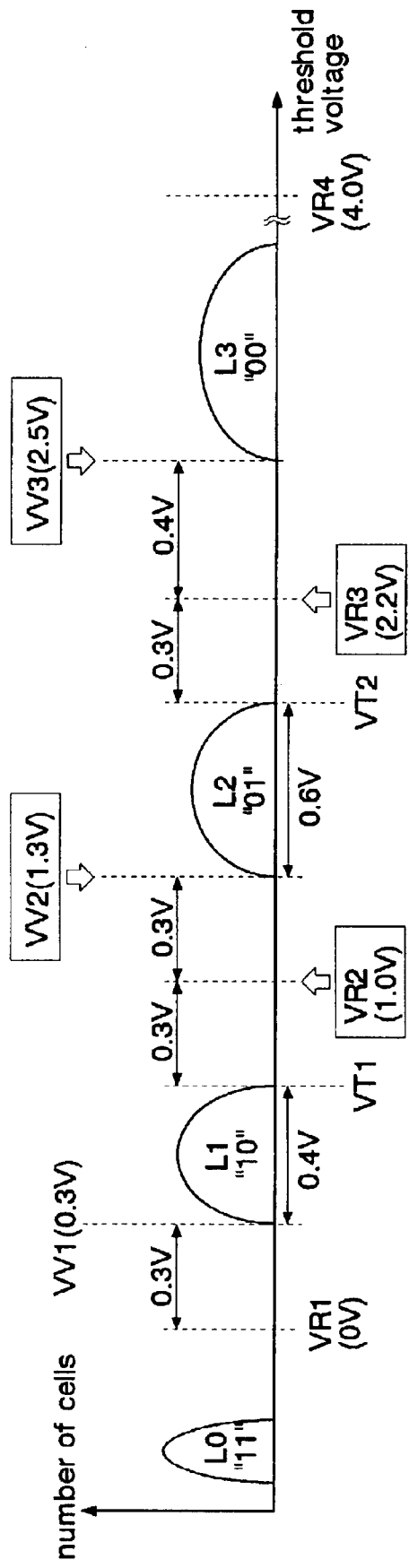
FIG. 6 is an explanatory diagram showing another example of the setting of the reference voltages and verification voltages according to the first embodiment.

FIG. 6 shows an overview of the setting of the reference voltages VR2–3 and the verification voltages VV2–3 for situations where the distributions L1–L3 of the threshold voltages shift due to variations of the fabrication process. Even if the fabrication process varies, the reference voltages VR2–3 can be set at between the distributions L1–L3, respectively. That is, predetermined read margins can be secured all the time.

As has been described, the first embodiment provides the internal voltage memory unit 22 which is rewritable from the exterior of the flash memory. The internal voltage generator 10 generates the reference voltages VR2–3 and the verification voltages VV2–3 according to the reference values VLR2–3 and the verification values VLV2–3 stored in the internal voltage memory unit 22. The memory cells of the flash memory can thus be evaluated for characteristics by using an LSI tester or the like before the reference voltages VR2–3 and the verification voltages VV2–3 are set in accordance with the evaluations. Consequently, the reference voltages VR2–3 and the verification voltages VV2–3 can be changed in accordance with the characteristics of the memory cells which are dependent on variations of the fabrication process. The distributions of threshold voltages corresponding to the logical values of write data can be optimized in accordance with the write characteristics of the memory cells. As a result, it is possible to improve the read margins of data from the memory cells with an enhancement in fabrication yield.

Figure 7:
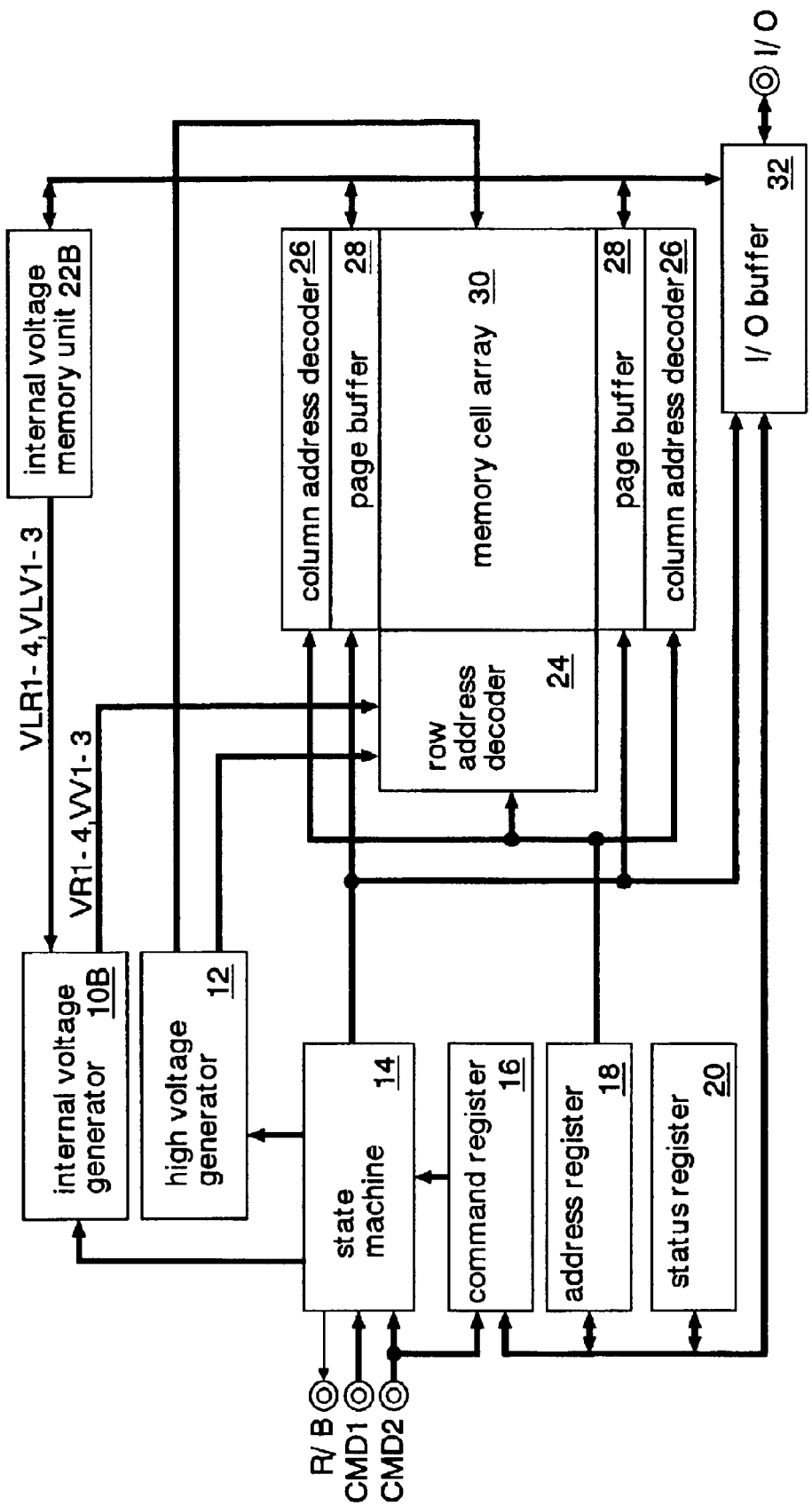
FIG. 7 is a block diagram showing a second embodiment of the present invention.

FIG. 7 shows a second embodiment of the nonvolatile multilevel cell memory of the present invention. The same elements as those of the first embodiment will be designated by identical reference numbers or symbols. Detailed description thereof will be omitted.

The nonvolatile multilevel cell memory is formed as a 64-Mbit NAND type flash memory on a silicon substrate by using CMOS processes. In this embodiment, an internal voltage generator 10B and an internal voltage memory unit 22B are formed instead of the internal voltage generator 10 and the internal voltage memory unit 22 of the first embodiment. The rest of the configuration is the same as in the first embodiment.

The internal voltage generator 10B generates reference voltages VR1, VR2, VR3, and VR4 and verification voltages VV1, VV2, and VV3 according to reference values VLR1, VLR2, VLR3, and VLR4 and verification values VLV1, VLV2, and VLV3 from the internal voltage memory unit 22B, respectively. The internal voltage generator 10B supplies the reference voltages VR and verification voltages VV generated to the row address decoder 24. That is, the internal voltage generator 10B operates as a reference voltage generator for generating the reference voltages VR1–3, a verification voltage generator for generating the verification voltage VV1–3, and a conduction voltage generator for generating the reference voltage (conduction voltage) VR4.

In a test mode, the internal voltage memory unit 22B receives the reference values VLR1, VLR2, VLR3, and VLR4 corresponding to the reference voltages VR1, VR2, VR3 and VR4 and the verification values VLV1, VLV2, and VLV3 corresponding to the verification voltages VV1, VV2, and VV3, which are supplied to the input/output terminal I/O, through the medium of the I/O buffer 32. The internal voltage memory unit 22B stores the values received. The reference values VLR1–4 and verification values VLV1–3 stored are output to the internal voltage generator 10B. That is, the internal voltage memory unit 22B operates as a first memory unit for storing the reference values VLR1–3, a second memory unit for storing the verification values VLV1–3, and a third memory unit for storing the reference value (conduction value) VLR4.

Figure 8:
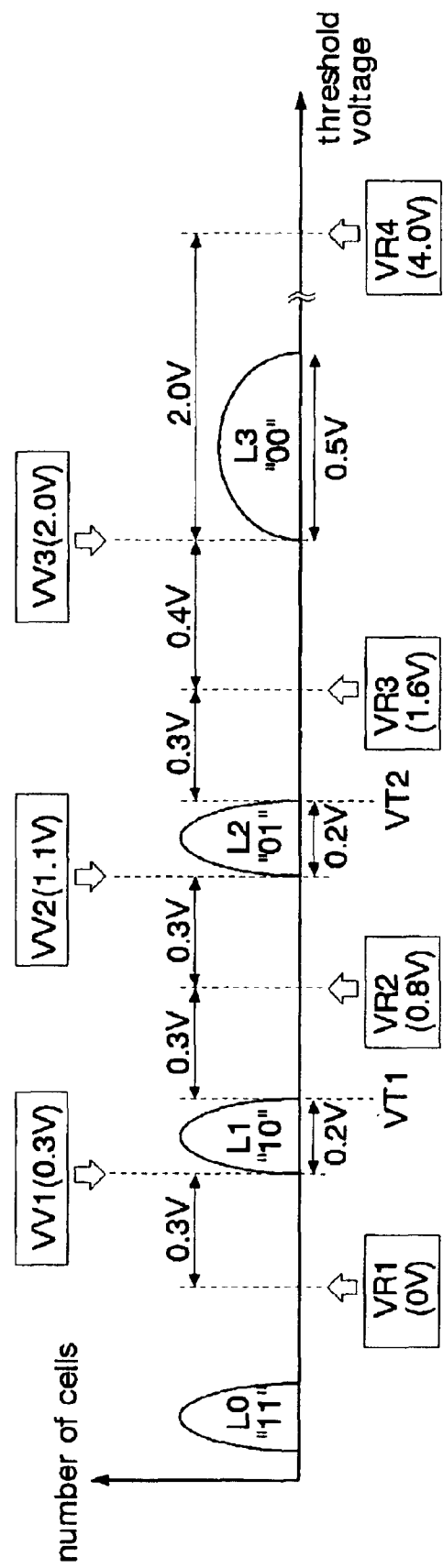
FIG. 8 is an explanatory diagram showing an overview of the setting of the reference voltages and verification voltages according to the second embodiment.

FIG. 8 shows an overview of the setting of the reference voltages VR1–4 and the verification voltages VV1–3 according to the second embodiment. In this example, the framed reference voltages VR1–4 and verification voltages VV1–3 are all set from the exterior of the flash memory by using an LSI tester in a testing process.

Initially, the flash memory is brought into the test mode by a command which is not used in normal operations. Then, based on the characteristics of the memory cells evaluated in advance, the reference value VLR1 corresponding to the reference voltage VR1 and the verification value VLV1 corresponding to the verification voltage VV1 are written to the internal voltage memory unit 22B.

Next, as in the first embodiment, a plurality of blocks BLK are measured for memory cell characteristics. The optimum reference voltages VR2–3 and verification voltages VV2–3 are obtained, and the reference values VLR2–3 and verification values VLV2–3 corresponding to these reference voltages VR2–3 and verification voltages VV2–3 are written to the internal voltage memory unit 22B.

Next, a margin of 2.0 V is added to the verification voltage VV3 to obtain the reference voltage VR4. Then, the reference value VLR4 corresponding to the reference voltage VR4 is written to the internal voltage memory unit 22B.

As has been described, the second embodiment can provide the same effects as those of the first embodiment. Besides, in this embodiment, all the reference voltages VR1–4 and verification voltages VV1–3 can be set from exterior. It is therefore possible to secure optimum read margins all the time according to the characteristics of the memory cells.

The internal voltage memory unit 22B is provided with a rewritable area in which the conduction voltage is stored as a conduction value. The conduction voltage can thus be changed in accordance with the characteristics of the memory cells which are dependent on variations of the fabrication process. Consequently, data can be read from the memory cells with reliability. The improved read margins allow an enhancement in fabrication yield.

Figure 9:
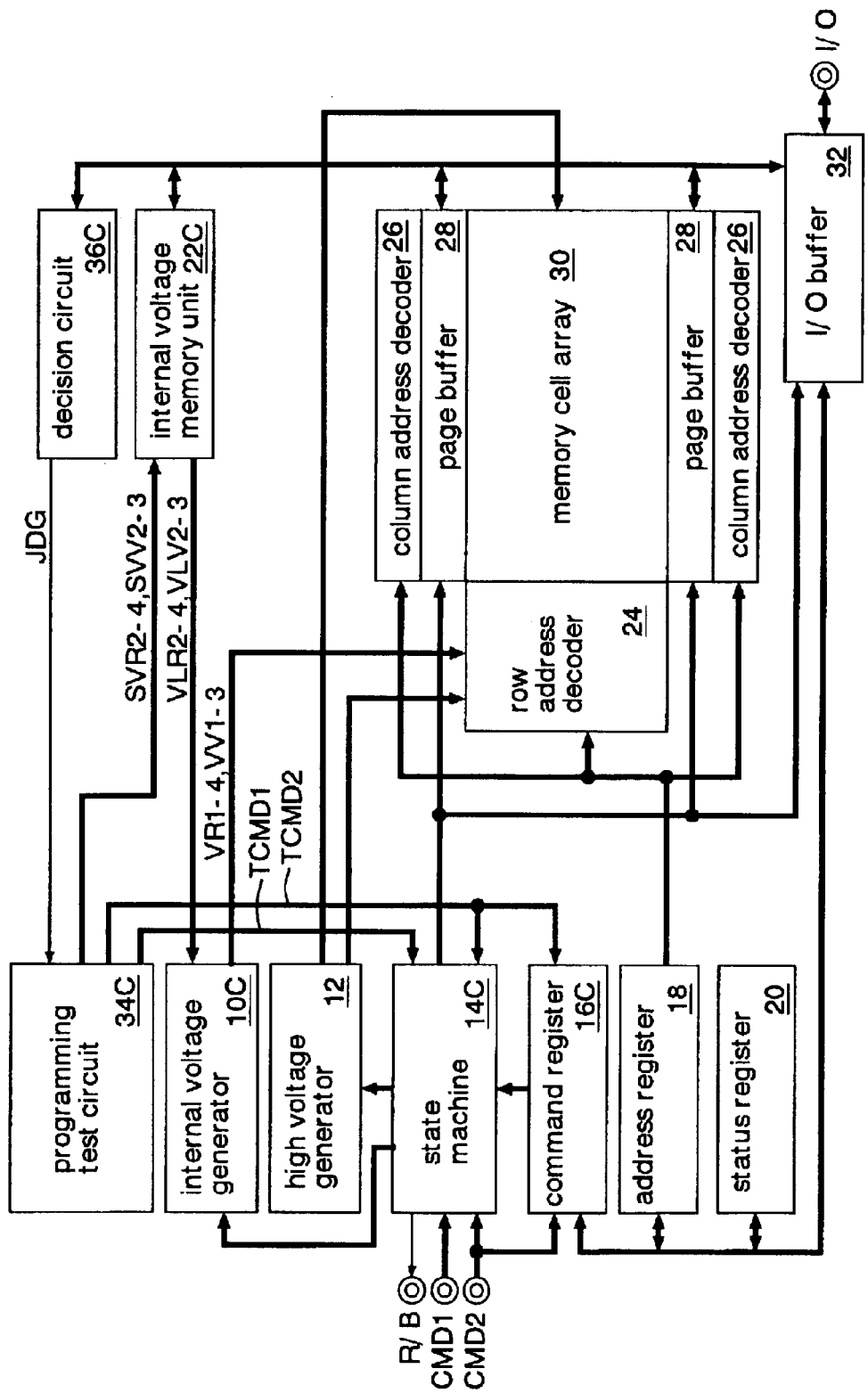
FIG. 9 is a block diagram showing a third embodiment of the present invention.

FIG. 9 shows a third embodiment of the nonvolatile multilevel cell memory of the present invention. The same elements as those of the first embodiment will be designated by identical reference numbers or symbols. Detailed description thereof will be omitted.

The nonvolatile multilevel cell memory is formed as a 64-Mbit NAND type flash memory on a silicon substrate by using CMOS processes. In this embodiment, an internal voltage generator 10C, a state machine 14C, a command register 16C, and an internal voltage memory unit 22C are formed instead of the internal voltage generator 10, the state machine 14, the command register 16, and the internal voltage memory unit 22 of the first embodiment. Moreover, a programming test circuit 34C and a decision circuit 36C are formed additionally. The rest of the configuration is the same as in the first embodiment.

The programming test circuit 34C has the function of operating in a test mode to set the reference voltages VR2, VR3, VR4 and the verification voltages VV2, VV3 according to the characteristics of the memory cells. The programming test circuit 34C generates a test pattern, and outputs the generated test pattern to the state machine 14C and the command register 16C as test command signals TCMD1 and TCMD2. The programming test circuit 34C outputs reference value setting signals SVR2, SVR3 and verification value setting signals SVV2, SVV3 according to a decision signal JDG which is output from the decision circuit 36C to show test results.

The internal voltage generator 10C generates the reference voltages VR2–4 and the verification voltages VV2–3 according to the reference values VLR2–4 and the verification values VLV2–3. The internal voltage generator 10C also generates a reference voltage VR1 (ground voltage; fixed to 0 V) and a verification voltage VV1 (fixed to 0.3 V).

The state machine 14C and the command register 16C, in the test mode, receive the test command signals TCMD1, TCMD2 and inhibit the reception of command signals CMD1, CMD2 from exterior. That is, in the test mode, the flash memory operates according to the test command signals TCMD1 and TCMD2 which are generated by the programming test circuit 34C.

The decision circuit 36C outputs the decision signal JDG in accordance with read data from the page buffers 28 when the programming test circuit 34C obtains the maximum value in a distribution of threshold voltages (L1 or L2 shown in FIG. 10 to be seen later).

In the test mode, the internal voltage memory unit 22C receives the reference value setting signals SVR2–3 and the verification value setting signals SVV2–3, or the reference values VLR2–3 and the verification values VLV2–3 supplied to the input/output terminal I/O, and stores the values received. That is, the internal voltage memory unit 22C is rewritable with the reference values VLR2–3 and the verification values VLV2–3 from exterior even after the reference values VLR2–3 and the verification values VLV2–3 are set by the programming test circuit 34C. The reference values VLR2–3 and verification values VLV2–3 stored are output to the internal voltage generator 10C. That is, the internal voltage memory unit 22C operates as a first memory unit for storing the reference values VLR and a second memory unit for storing the verification values VLV.

Figure 10:
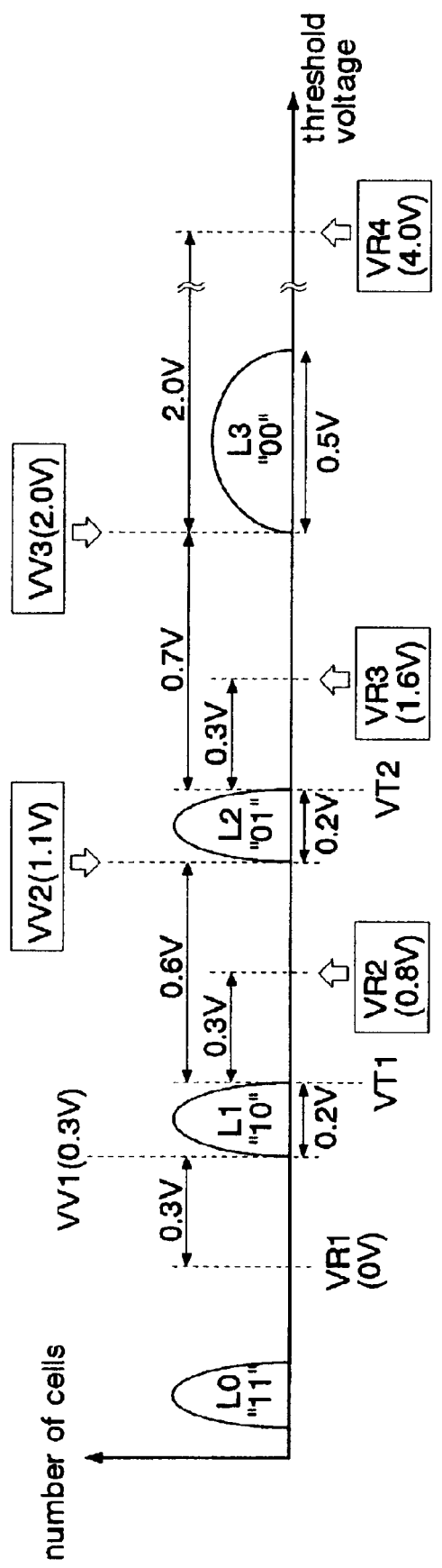
FIG. 10 is an explanatory diagram showing an overview of the setting of the reference voltages and verification voltages according to the third embodiment.

FIG. 10 shows an overview of the setting of the reference voltages VR2–4 and the verification voltages VV2–3 according to the third embodiment. In this example, the framed reference voltages VR2–4 and verification voltages VV2–3 are set by the programming test circuit 34C.

Otherwise, the reference voltages VR2–4 and the verification voltages VV2–3 may be set from exterior. The reference voltage VR1 (ground voltage; 0 V) and the verification voltage VV1 (0.3 V) are fixed values to be generated by the internal voltage generator 10C shown in FIG. 9.

Figure 11:
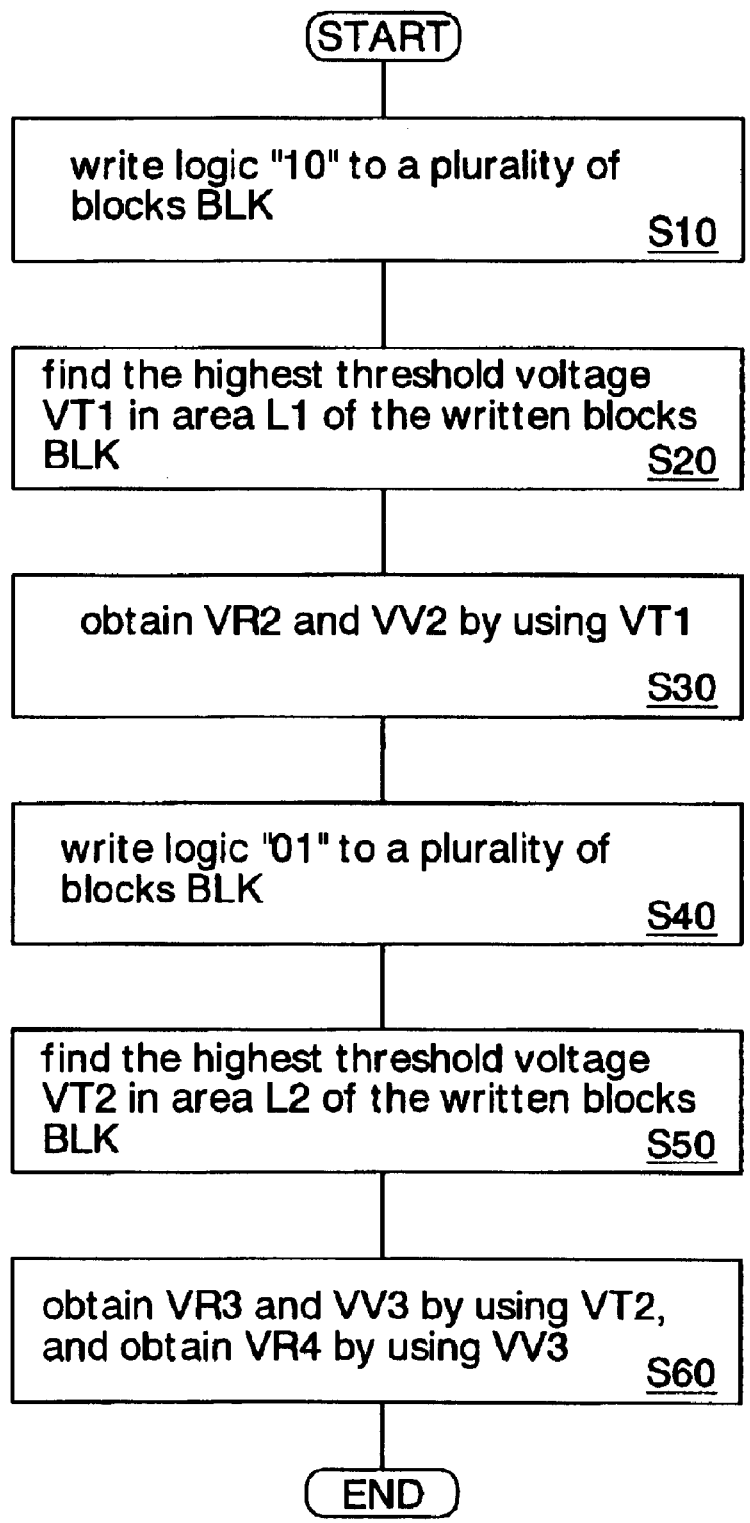
FIG. 11 is a flowchart showing an overview of operation of a programming test circuit according to the third embodiment.

FIG. 11 shows an overview of operation of the programming test circuit 34C shown in FIG. 9.

In the testing process, the flash memory is brought into the test mode by a command which is not used in normal operations. If the test command supplied in the test mode is an internal voltage setting command, the flash memory activates the programming test circuit 34C.

Initially, at step S10, the programming test circuit 34C outputs the test command signals TCMD1 and TCMD2 to the state machine 14C and the command register 16C shown in FIG. 9, to write logic "10" to a plurality of blocks BLK. The threshold voltages of the memory cells fall into the area L1 shown in FIG. 10.

At step 520, the programming test circuit 34C finds the highest threshold voltage VT1 in the area L1. Next, at step S30, the programming test circuit 34C obtains the reference voltage VR2 and the verification voltage VV2 by using the threshold voltage VT1.

At step S40, the programming test circuit 34C writes logic "01" to a plurality of blocks BLK. The threshold voltages of the memory cells fall into the area L2.

At step S50, the programming test circuit 34C finds the highest threshold voltage VT2 in the area L2. Next, at step S60, the programming test circuit 34C obtains the reference voltage VR3 and the verification voltage VV3 by using the threshold voltage VT2. The programming test circuit 34C further obtains the reference voltage VR4 by using the verification voltage VV3 obtained.

Figure 12:
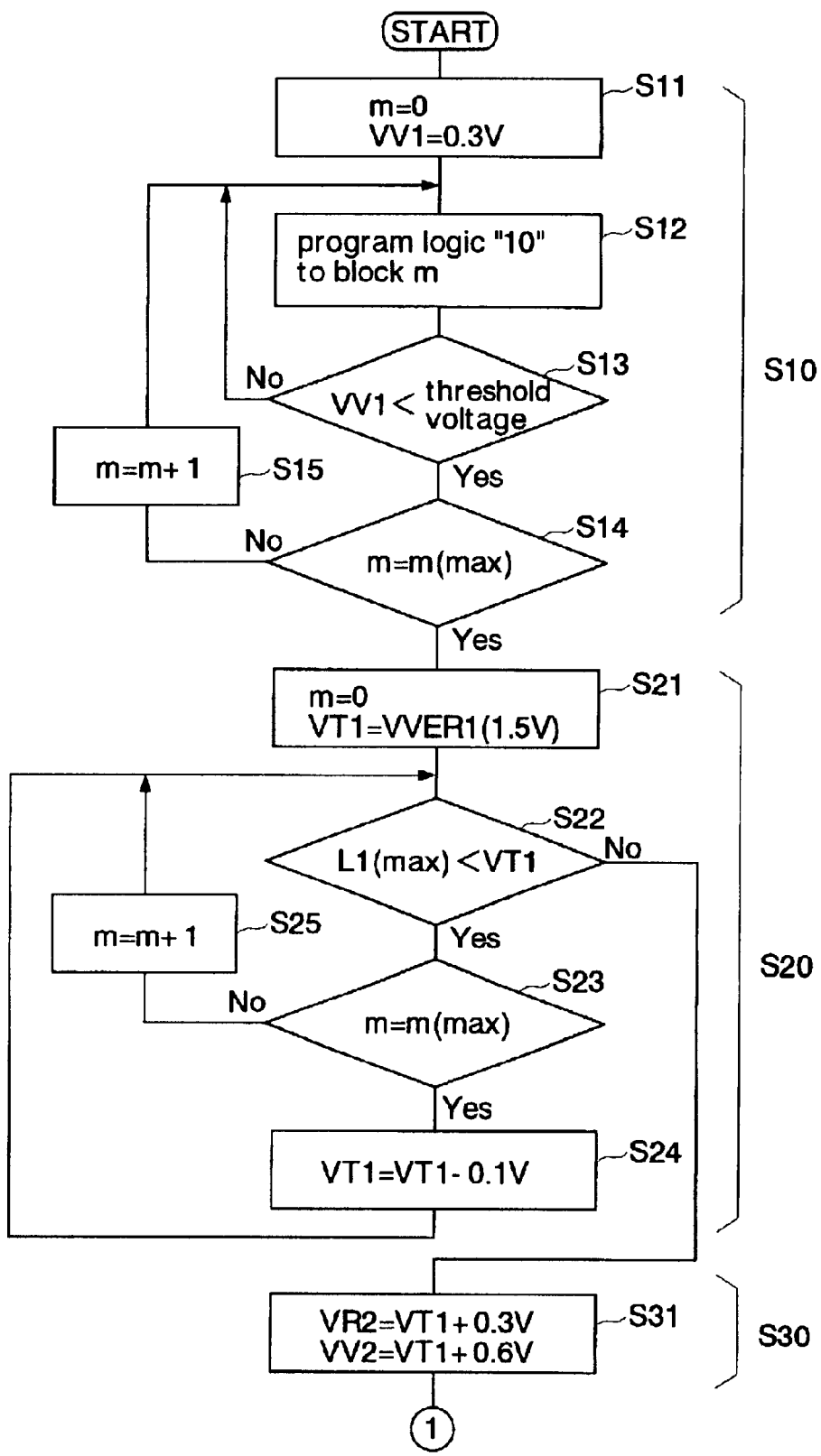
FIG. 12 is a flowchart showing the details of the operation of the programming test circuit according to the third embodiment.

FIG. 12 shows the details of steps S10, S20, and S30 shown in FIG. 11.

Initially, at step S11, a count m for indicating the number of a block BLK is reset to "0". In addition, the verification voltage VV1 is set to 0.3 V. As step S12, logic "10" is programmed to the block BLKm.

At step S13, it is determined if each individual memory cell exceeds the verification voltage VV1 in threshold voltage. When memory cells exceed the verification voltage VV1 in threshold voltage, the programming of logic "10" is finished and the processing moves to step S14. If memory cells are yet to exceed the verification voltage VV1 in threshold voltage, the processing of step S12 is performed again.

Next, at step S14, whether the count m is the maximum or not is determined. If the count m is not the maximum, the processing moves to step S15. If the count m is the maximum, it is determined that all the blocks BLK to be tested are programmed with logic "10", so that the processing moves to step S21. At step S15, the count m is incremented by "1", and the processing moves to step S12 again.

At step S21, the count m is reset to "0". Besides, the maximum value VT1 of the threshold voltages in the distribution L1 is set to VVER1 (1.5 V). VVER1 is a value impossible for the threshold voltages in the distribution L1 to take.

At step S22, it is determined whether or not the maximum value L1 (max) in the distribution L1 of threshold voltages of the actual memory cells in the block BLKm is smaller than the maximum value VT1. If the maximum value L1 (max) is smaller than the maximum value VT1, the processing moves to step S23. If the maximum value L1 (max) is greater than or equal to the maximum value VT1, the maximum value VT1 is decided to be equal to the actual maximum value L1 (max). Then, the processing moves to step S31. Specifically, the decision circuit 36C shown in FIG. 9 compares the read data from the memory cell array 30 with the expected value. The decision circuit 36C outputs the decision signal JDG if the read data differs from the expected value (i.e., in the event of fail). On receiving the decision signal JDG, the programming test circuit 34C determines that the maximum value VT1 is equal to the actual maximum value L1 (max).

At step S23, whether the count m is the maximum or not is determined. If the count m is not the maximum, the processing moves to step S25. If the count m is the maximum, the processing moves to step S24. At step S25, the count m is incremented by "1", and the processing moves to step S22 again. At step S24, the maximum value VT1 is decreased by 0.1 V, and the processing moves to step S22 again.

Incidentally, the foregoing steps S22–25 show the flow for obtaining the maximum value L1 (max) of the threshold voltages of the memory cells with respect to each block BLKm. In fact, the maximum value VT1 is the highest threshold voltage among all the blocks BLK to be evaluated.

At step S31, 0.3 V is added to the maximum value VT1 of the threshold voltage to obtain the reference voltage VR2. In the meantime, 0.6 V is added to the maximum value VT1 to obtain the verification voltage VV2. The reference voltage VR2 and verification voltage VV2 obtained are written to the internal voltage memory unit 22C as the reference value setting signal SVR2 and verification value setting signal SW2, respectively. Subsequently, the processing moves to step S41.

Figure 13:
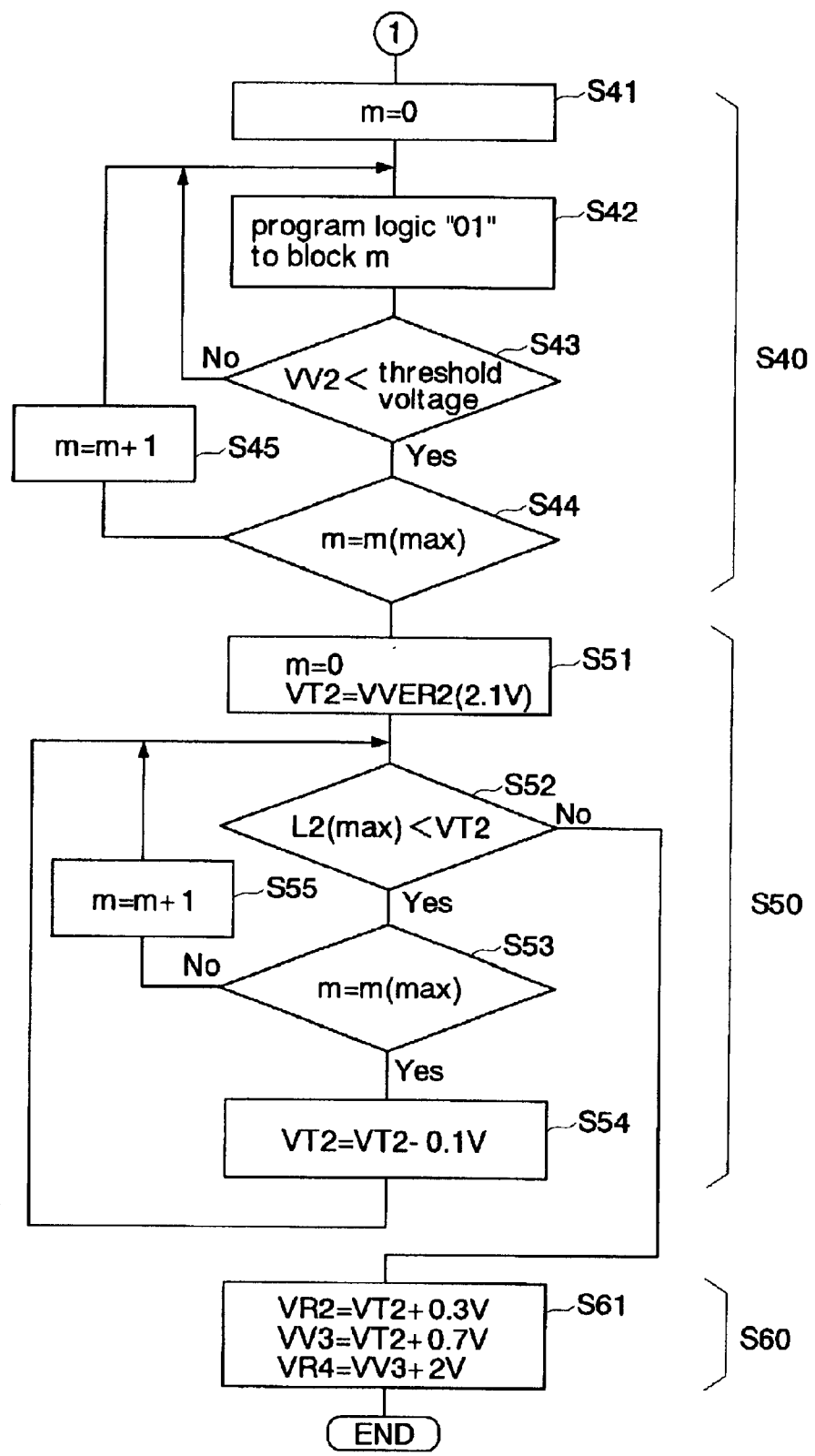
FIG. 13 is a flowchart showing the details of the operation of the programming test circuit according to the third embodiment.

At step S41 shown in FIG. 13, the count m is reset to "0". As step S42, logic "01" is programmed to the block BLKm.

At step S43, it is determined if each individual memory cell exceeds the verification voltage VV2 in threshold voltage. When memory cells exceed the verification voltage VV2 in threshold voltage, the programming of logic "01" is finished and the processing moves to step S44. If memory cells are yet to exceed the verification voltage VV2 in threshold voltage, the processing of step S42 is performed again.

Next, at step S44, whether the count m is the maximum or not is determined. If the count m is not the maximum, the processing moves to step S45. If the count m is the maximum, it is determined that all the blocks BLK to be tested are programmed with logic "01", so that the processing moves to step S51. At step S45, the count m is incremented by "1", and the processing moves to step S42 again.

At step S51, the count m is reset to "0". Besides, the maximum value VT2 of the threshold voltages in the distribution L2 is set to VVER2 (2.1 V). VVER2 is a value impossible for the threshold voltages in the distribution L2 to take.

At step S52, it is determined whether or not the maximum value L2 (max) in the distribution L2 of threshold voltages of the actual memory cells in the block BLKm is smaller than the maximum value VT2. If the maximum value L2 (max) is smaller than the maximum value VT2, the processing moves to step S53. If the maximum value L2 (max) is greater than or equal to the maximum value VT2, the maximum value VT2 is decided to be equal to the actual maximum value L2 (max). Then, the processing moves to step S61. Incidentally, as with step S22, the decision of step S52 is also made by using the decision circuit 36C.

At step S53, whether the count m is the maximum or not is determined. If the count m is not the maximum, the processing moves to step S55. If the count m is the maximum, the processing moves to step S54. At step S55, the count m is incremented by "1", and the processing moves to step S52 again. At step S54, the maximum value VT2 is decreased by 0.1 V, and the processing moves to step S52 again.

Incidentally, the foregoing steps S52–S55 show the flow for obtaining the maximum value L2 (max) of the threshold voltages of the memory cells with respect to each block BLKm. In fact, the maximum value VT2 is the highest threshold voltage among all the blocks BLK to be evaluated.

At step S61, 0.3 V is added to the maximum value VT2 of the threshold voltage to obtain the reference voltage VR3. In the meantime, 0.7 V is added to the maximum value VT2 to obtain the verification voltage VV3. Moreover, 2 V is added to the verification voltage VV3 to obtain the reference voltage VR4 (conduction voltage). The reference voltages VR3, VR4 and verification voltage VV3 obtained are written to the internal voltage memory unit 22C as the reference value setting signals SVR3, SVR4 and verification value setting signal SVV3, respectively.

Then, in the test mode, the reference voltages VR2–4 and the verification voltages VV2–3 are set.

As has been described, the third embodiment can provide the same effects as those of the first and second embodiments. In addition, there is provided the programming test circuit 34C which operates in the test mode to obtain the reference voltages VR2–4 and the verification voltages VV2–3 based on the distributions L1 and L2 of the threshold voltages of the memory cells. Consequently, the reference voltages VR2–4 and the verification voltages VV2–3 can be set after the fabrication of the flash memory, according to the characteristics of the memory cells which are dependent on variations of the fabrication process. It is therefore possible to improve the read margins of data from the memory cells. Moreover, the distributions of threshold voltages corresponding to the logical values of write data can be optimized in accordance with the write characteristics of the memory cells. This results in an enhanced fabrication yield.

Furthermore, since the programming test circuit 34C for setting the reference voltages VR2–4 and the verification voltages VV2–3 is built in the flash memory, the reference voltages VR2–4 and the verification voltages VV2–3 can be set, for example, by bringing the flash memory into the test mode with a simple LSI tester. On this account, a number of flash memories can be set with the reference voltages VR2–4 and the verification voltages VV2–3 at a time. As a result, the test time can be reduced with a reduction in fabrication cost.

Since the internal voltage memory unit 22C is rewritable from the exterior of the flash memory, the memory cells can be easily evaluated for characteristics at the time of developing the cell memory or at the start of mass production, for example.

The reference voltage VR1 and verification voltage VV1, which correspond to memory cell characteristics less susceptible to variations of the fabrication process, are fixed to the ground voltage and 0.3 V, respectively. This can simplify the logic of the programming test circuit 34C. As a result, the flash memory can be reduced in chip size with a reduction in fabrication cost.

The programming test circuit 34C is operated to obtain the subsequent reference voltages VR2–4 and verification voltages VV2–3 in succession by using the verification voltage VV1, a fixed voltage. Consequently, the simple operation flow can be repeated to obtain the reference voltages VR2–4 and the verification voltages VV2–3 in succession. As a result, the programming test circuit 34C can be simplified in logic with a reduction in chip size.

Figure 14:
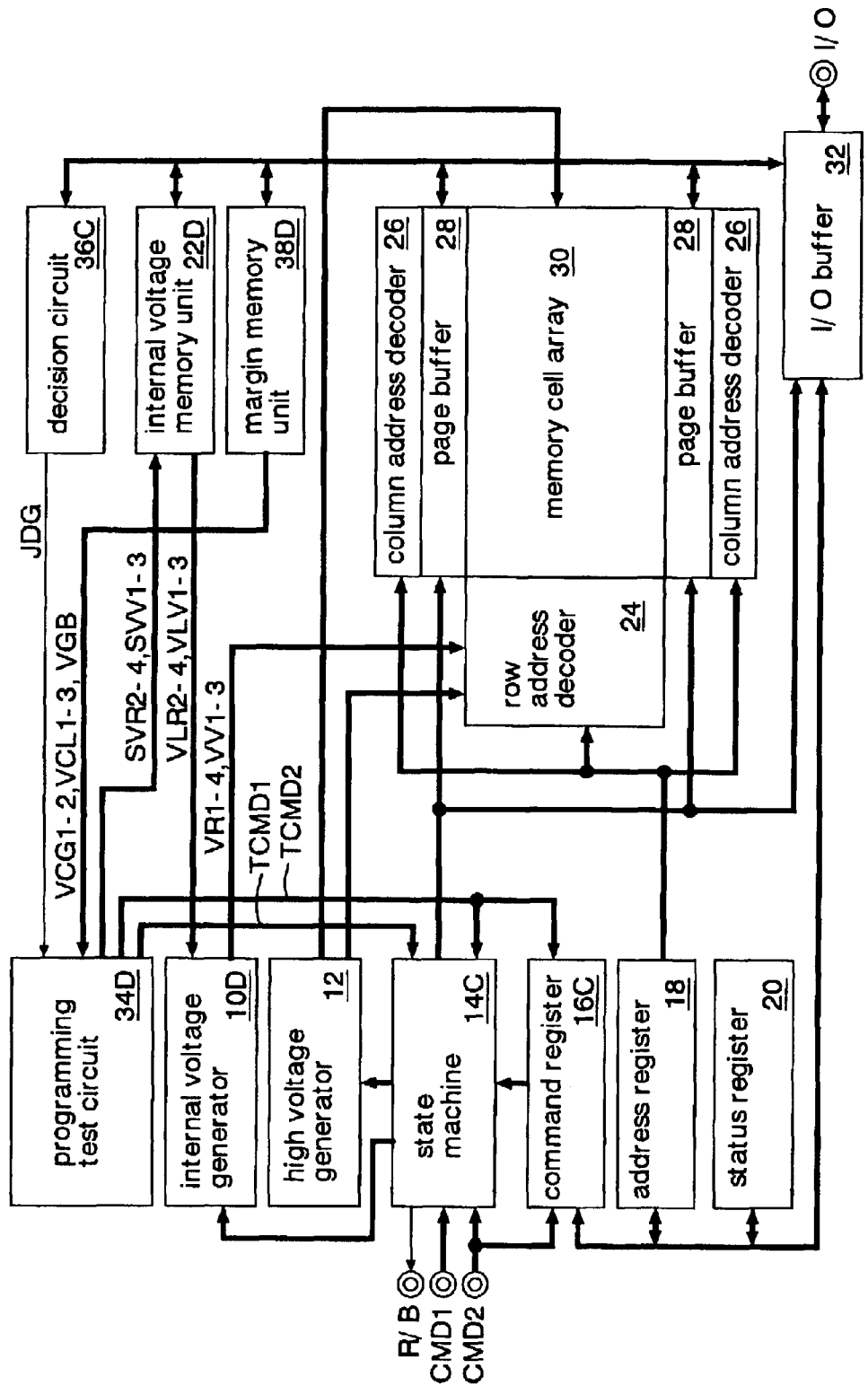
FIG. 14 is a block diagram showing a fourth embodiment of the present invention.

FIG. 14 shows a fourth embodiment of the nonvolatile multilevel cell memory of the present invention. The same elements as those of the first and third embodiments will be designated by identical reference numbers or symbols. Detailed description thereof will be omitted.

The nonvolatile multilevel cell memory is formed as a 64-Mbit NAND type flash memory on a silicon substrate by using CMOS processes. In this embodiment, a programming test circuit 34D, an internal voltage generator 10D, and an internal voltage memory unit 22D are formed instead of the programming test circuit 34C, the internal voltage generator 10C, and the internal voltage memory unit 22C of the third embodiment. Moreover, a margin memory unit 38D is formed additionally. The rest of the configuration is the same as in the third embodiment.

The programming test circuit 34D has the function of operating in a test mode to set the reference voltages VR2–3, the verification voltages VV1–3, and the reference voltage VR4 according to the characteristics of the memory cells and first margins VCG1, VCG2, second margins VCL1, VCL2, VCL3, and a third margin VGB from the margin memory unit 38D. The first margins VCG1 and VCG2 are values obtained by adding a predetermined margin (design/fabrication margin; 0.1 V) to a maximum variation in threshold voltage (0.2 V) under the charge-gain characteristic. The second margins VCL1, VCL2, and VCL3 are values obtained by adding a predetermined margin (design/fabrication margin; 0.1 V) to a maximum variation in threshold voltage (0.2 V or 0.3 V) under the charge-loss characteristic. The third margin VGB is a value corresponding to a difference between the highest programmable threshold voltage and the reference voltage VR4. For example, the third margin VGB is set to 2 V.

The programming test circuit 34D also outputs reference value setting signals SVR2–4 and verification value setting signals SVV1–3 according to the decision signal JDG from the decision circuit 36C which shows test results. The rest of the facilities are almost the same as those of the programming test circuit 34C in the third embodiment.

The internal voltage generator 10D generates the reference voltages VR1–4 and the verification voltages VV1–3 according to the reference values VLR2–4 and the verification values VLV1–3. The internal voltage generator 10D also operates as a conduction voltage generator for generating the reference voltage (conduction voltage) VR4.

The margin memory unit 38D contains a plurality of nonvolatile memory cells having a floating gate. In the test mode, the margin memory unit 38D receives the first margins VCG1–2, the second margins VCL1–3, and the third margin VGB supplied to the input/output terminal I/O, through the medium of the I/O buffer 32. The margin memory unit 38D stores the received values into its nonvolatile memory cells. The margins VCG1–2, VCL1–3, and VGB stored are output to the programming test circuit 34D. That is, the margin memory unit 38D operates as a first margin memory unit for storing the first margins VCG1–2, a second margin memory unit for storing the second margins VCL1–3, and a third margin memory unit for storing the third margin VGB.

Figure 15:
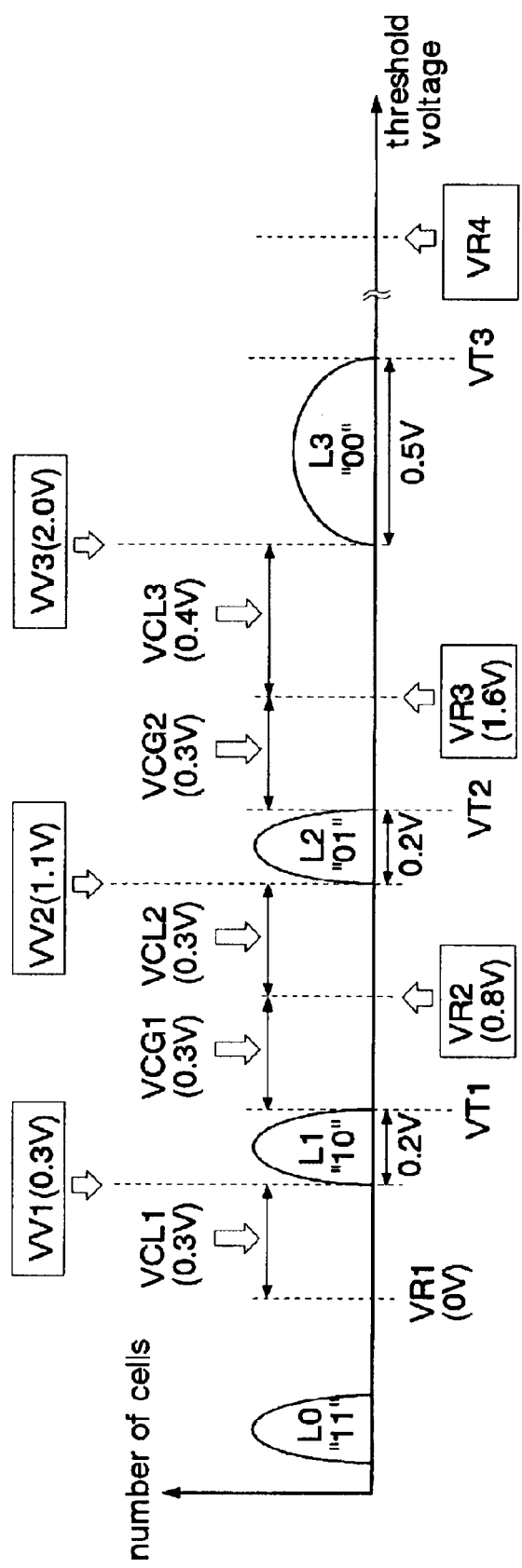
FIG. 15 is an explanatory diagram showing an overview of the setting of the reference voltages and verification voltages according to the fourth embodiment.

FIG. 15 shows an overview of the setting of the reference voltages VR2–4 and the verification voltages VV1–3 according to the fourth embodiment. In this example, the framed reference voltages VR2–4 and verification voltages VV1–3 are set by the programming test circuit 34D. The reference voltage VR1 (ground voltage; 0 V) is a fixed value to be generated by the internal voltage generator 10D shown in FIG. 14.

Figure 16:
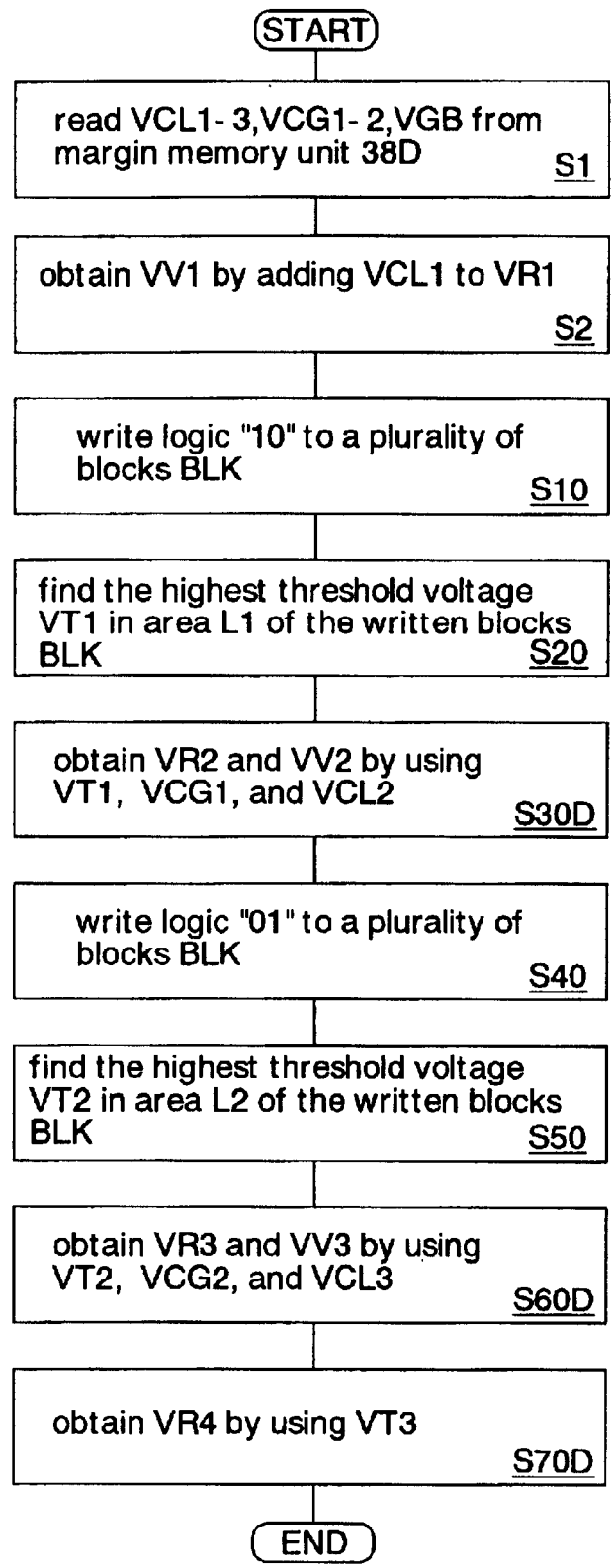
FIG. 16 is a flowchart showing an overview of operation of the programming test circuit according to the fourth embodiment.

FIG. 16 shows an overview of operation of the programming test circuit 34D shown in FIG. 14. In this example, the programming test circuit 34D executes steps S1 and S2, and then steps S10, S20, S30D, S40, S50, S60D, and S70D. Steps S10, S20, S40, and S50 are the same as in the third embodiment (FIG. 11).

In the testing process, the flash memory is brought into the test mode by a command which is not used in normal operations. If the test command supplied in the test mode is an internal voltage setting command, the flash memory activates the programming test circuit 34D.

Initially, at step S1, the programming test circuit 34D reads the first margins VCG1–2, the second margins VCL1–3, and the third margin VGB from the margin memory unit 38D.

Next, at step S2, the programming test circuit 34D adds the second margin VCL1 to the reference voltage VR1, a fixed value, to obtain the verification voltage VV1. Next, steps S10–S20 are executed.

Subsequently, at step S30D, the programming test circuit 34D obtains the reference voltage VR2 and the verification voltage VV2 by using the highest threshold voltage VT1 in the area L1, the first margin VCG1, and the second margin VCL2. Next, steps S40–S50 are executed.

Next, at step S60D, the programming test circuit 34D obtains the reference voltage VR3 and the verification voltage VV3 by using the highest threshold voltage VT2 in the area L2, the first margin VCG2, and the second margin VCL3.

Next, at step S70D, the programming test circuit 34D adds the third margin VGB to the highest threshold voltage VT3 in the area L3 to obtain the reference voltage VR4.

The reference voltages VR2–4 and verification voltages VV1–3 obtained are written to the internal voltage memory unit 22D as the reference values VLR2–4 (reference value setting signals SVR2–4) and verification values VLV1–3 (verification value setting signals SVV1–3). Subsequently, in a normal operation mode, the internal voltage generator 10D generates the reference voltages VR2–4 and the verification voltages VV1–3 according to the reference values VLR2–4 and the verification values VLV1–3 stored in the internal voltage memory unit 22D.

As has been described, the fourth embodiment can provide the same effects as those of the third embodiment. Moreover, the provision of the margin memory unit 38D which is rewritable from the exterior of the flash memory allows adjustments to the reference voltages VR and the verification voltages VV in accordance with the charge-gain characteristic and charge-loss characteristic of the memory cells.

The foregoing embodiments have dealt with the cases where the present invention is applied to a flash memory having nonvolatile memory cells for storing four levels each. The present invention is not limited thereto. For example, the present invention may be applied to a flash memory having nonvolatile memory cells for storing eight or more levels each.

The foregoing embodiments have dealt with the cases where the present invention is applied to a flash memory.

The present invention is not limited thereto. For example, the present invention may be applied to a flash memory core to be mounted on a system LSI.

The foregoing embodiments have dealt with the cases where the present invention is applied to a flash memory of NAND type. The present invention is not limited thereto. For example, the present invention may be applied to a flash memory of NOR type. The present invention may also be applied to nonvolatile semiconductor memories other than flash memories.

The invention is not limited to the above embodiments and various modifications may be made without departing from the spirit and scope of the invention. Any improvement may be made in part or all of the components.

What is claimed is:

1. A nonvolatile multilevel cell memory comprising:
   electrically-rewritable nonvolatile multilevel memory cells;
   a programming voltage generator for generating a plurality of programming voltages to change threshold voltage in each of said memory cells according to logic of write data;
   a first memory unit for storing a plurality of reference values respectively corresponding to a plurality of reference voltages for judging the threshold voltages of said memory cells, at least one of said reference values being rewritable; and
   a reference voltage generator for generating said reference voltages, respectively, according to said reference values stored in said first memory unit, when reading data from said memory cells.

2. The nonvolatile multilevel cell memory according to claim 1, comprising:
   a plurality of memory cell strings each including a plurality of said memory cells connected in series;
   a conduction voltage generator for generating, when accessing said memory cells, a conduction voltage to be applied to unselected memory cells in said memory cell strings; and
   a third memory unit for storing said conduction voltage as a conduction value, said third memory unit being rewritable, wherein
     said conduction voltage generator generates said conduction voltage according to said conduction value stored in said third memory unit.

3. A nonvolatile multilevel cell memory comprising:
   electrically-rewritable nonvolatile multilevel memory cells;
   a programming voltage generator for generating a plurality of programming voltages to change threshold voltage in each of said memory cells according to logic of write data;
   a second memory unit for storing a plurality of verification values respectively corresponding to a plurality of verification voltages for verifying distributions of the threshold voltages of said memory cells, at least one of said verification values being rewritable; and
   a verification voltage generator for generating said verification voltages, respectively, according to said verification values stored in said second memory unit, when writing data to said memory cells.

4. The nonvolatile multilevel cell memory according to claim 3, comprising:
   a plurality of memory cell strings each including a plurality of said memory cells connected in series;

a conduction voltage generator for generating, when accessing said memory cells, a conduction voltage to be applied to unselected memory cells in said memory cell strings; and a third memory unit for storing said conduction voltage as a conduction value, said third memory unit being rewritable, wherein
said conduction voltage generator generates said conduction voltage according to said conduction value stored in said third memory unit.

5. A nonvolatile multilevel cell memory comprising:

electrically-rewritable nonvolatile multilevel memory cells;

a programming voltage generator for generating a plurality of programming voltages to change threshold voltage in each of said memory cells according to logic of write data;

a reference voltage generator for generating a plurality of reference voltages for judging the threshold voltages of said memory cells when reading data from said memory cells;

a verification voltage generator for generating, when writing data to said memory cells, a plurality of verification voltages to verify that the threshold voltages of said memory cells exceed a value corresponding to said data; and a programming test circuit for operating in a test mode, for programming each of said memory cells according to the logic of said write data, and for obtaining at least one of said reference voltages and at least one of said verification voltages based on distributions of the threshold voltages of said memory cells programmed, wherein
said reference voltage generator generates at least one of said reference voltages according to a value obtained by said programming test circuit, and
said verification voltage generator generates at least one of said verification voltages according to a value obtained by said programming test circuit.

6. The nonvolatile multilevel cell memory according to claim 5, comprising
a first memory unit for storing a plurality of reference values corresponding to said reference voltages, respectively, at least one of said reference values being rewritable, wherein
said reference voltage generator generates said reference voltages according to said reference values stored in said first memory unit.

7. The nonvolatile multilevel cell memory according to claim 5, comprising
a second memory unit for storing a plurality of verification values corresponding to said verification voltages, respectively, at least one of said verification values being rewritable, wherein
said verification voltage generator generates said verification voltages according to said verification values stored in said second memory unit.

8. The nonvolatile multilevel cell memory according to claim 5, wherein:
said reference voltages include a lowest reference voltage having a fixed value, and said verification voltages include a lowest verification voltage having a fixed value; and
said programming test circuit obtains at least one of said reference voltages excluding said lowest reference voltage and obtains at least one of said verification voltages excluding said lowest verification voltage.

9. The nonvolatile multilevel cell memory according to claim 8, wherein
said lowest reference voltage is fixed to a ground voltage.

10. The nonvolatile multilevel cell memory according to claim 8, wherein
said programming test circuit obtains said reference voltages and said verification voltages by repeating the operations of:
programming said memory cells with one of said verification voltages;
measuring a highest threshold voltage of a plurality of said memory cells programmed;
adding a first margin to said highest threshold voltage measured to obtain one of said reference voltages; and
adding a second margin to said obtained reference voltage to obtain next one of said verification voltages.

11. The nonvolatile multilevel cell memory according to claim 10, wherein:
said memory cells each have a floating gate; and
said first margin is established in accordance with a charge-gain characteristic of increasing in number of electrons in said floating gate.

12. The nonvolatile multilevel cell memory according to claim 10, wherein:
said memory cells each have a floating gate; and
said second margin is established in accordance with a charge-loss characteristic of decreasing in number of electrons in said floating gate.

13. The nonvolatile multilevel cell memory according to claim 5, wherein:
said reference voltages which include a lowest reference voltage is a fixed value; and
said programming test circuit obtains at least one of said reference voltages excluding said lowest reference voltage and obtains at least one of said verification voltages.

14. The nonvolatile multilevel cell memory according to claim 13, wherein
said lowest reference voltage is fixed to a ground voltage.

15. The nonvolatile multilevel cell memory according to claim 13, wherein
said programming test circuit obtains said reference voltages and said verification voltages by repeating the operations of:
adding a second margin to one of said reference voltages to obtain one of said verification voltages;
measuring a highest threshold voltage of a plurality of said memory cells programmed with said obtained verification voltage; and
adding a first margin to said highest threshold voltage measured to obtain next one of said reference voltages.

16. The nonvolatile multilevel cell memory according to claim 15, wherein:
said memory cells each have a floating gate; and
said first margin is established in accordance with a charge-gain characteristic of increasing in number of electrons in said floating gate.

17. The nonvolatile multilevel cell memory according to claim 15, wherein:
  said memory cells each have a floating gate; and
  said second margin is established in accordance with a charge-loss characteristic of decreasing in number of electrons in said floating gate.

18. The nonvolatile multilevel cell memory according to claim 5, comprising:
  a plurality of memory cell strings each including a plurality of said memory cells connected in series; and
  a conduction voltage generator for generating, when accessing said memory cells, a conduction voltage to be applied to unselected memory cells in said memory cell strings by adding a third margin to a maximum value in a highest distribution of threshold voltages out of a plurality of distributions of threshold voltages corresponding to the logic of said write data.

19. The nonvolatile multilevel cell memory according to claim 5, comprising:
  a plurality of memory cell strings each including a plurality of said memory cells connected in series;
  a conduction voltage generator for generating, when accessing said memory cells, a conduction voltage to be applied to unselected memory cells in said memory cell strings; and
  a third memory unit for storing said conduction voltage as a conduction value, said third memory unit being rewritable, wherein
    said conduction voltage generator generates said conduction voltage according to said conduction value stored in said third memory unit.

* * * * *